(12) United States Patent
Johnson et al.

(10) Patent No.: US 6,886,147 B2
(45) Date of Patent: Apr. 26, 2005

(54) METHOD, SYSTEM, AND PRODUCT FOR ACHIEVING OPTIMAL TIMING IN A DATA PATH THAT INCLUDES VARIABLE DELAY LINES AND COUPLED ENDPOINTS

(75) Inventors: Gregory A. Johnson, Colorado Springs, CO (US); Andrew Carl Brown, Colorado Springs, CO (US); Travis Alister Bradfield, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 134 days.

(21) Appl. No.: 10/335,312

(22) Filed: Dec. 31, 2002

(65) Prior Publication Data

US 2004/0128634 A1 Jul. 1, 2004

(51) Int. Cl.[7] .................................................. G06F 9/45
(52) U.S. Cl. ................................ 716/6; 716/5; 716/10
(58) Field of Search ........................................ 716/1–13

(56) References Cited

U.S. PATENT DOCUMENTS

| | | | | |
|---|---|---|---|---|
| 6,038,384 A | * | 3/2000 | Ehrler | 716/6 |
| 6,044,209 A | * | 3/2000 | Alpert et al. | 716/6 |
| 6,167,557 A | * | 12/2000 | Kudva et al. | 716/6 |
| 6,643,832 B1 | * | 11/2003 | Ray et al. | 716/6 |
| 6,701,505 B1 | * | 3/2004 | Srinivasan | 716/10 |

* cited by examiner

*Primary Examiner*—Vuthe Siek
*Assistant Examiner*—Binh Tat
(74) *Attorney, Agent, or Firm*—Yee & Associates, P.C.

(57) ABSTRACT

The present invention is a method, system, and product for optimizing timing in a circuit after layout of the circuit has been completed. The circuit includes at least one variable delay line and includes coupled endpoint devices. The variable delay line includes multiple, different selectable settings. A current setting of the variable delay line is varied from a maximum setting to a minimum setting. A timing accuracy indicator of a combination of the coupled endpoint devices is determined as the variable delay line is varied from its maximum setting to its minimum setting. Thus, multiple timing accuracy indicators are determined where an indicator is determined for and associated with each one of the settings from the maximum setting to the minimum setting. An optimum one of the selectable settings is determined utilizing the timing accuracy indicators, wherein the optimum one of the settings is associated with an optimum one of the multiple timing accuracy indicators.

39 Claims, 5 Drawing Sheets

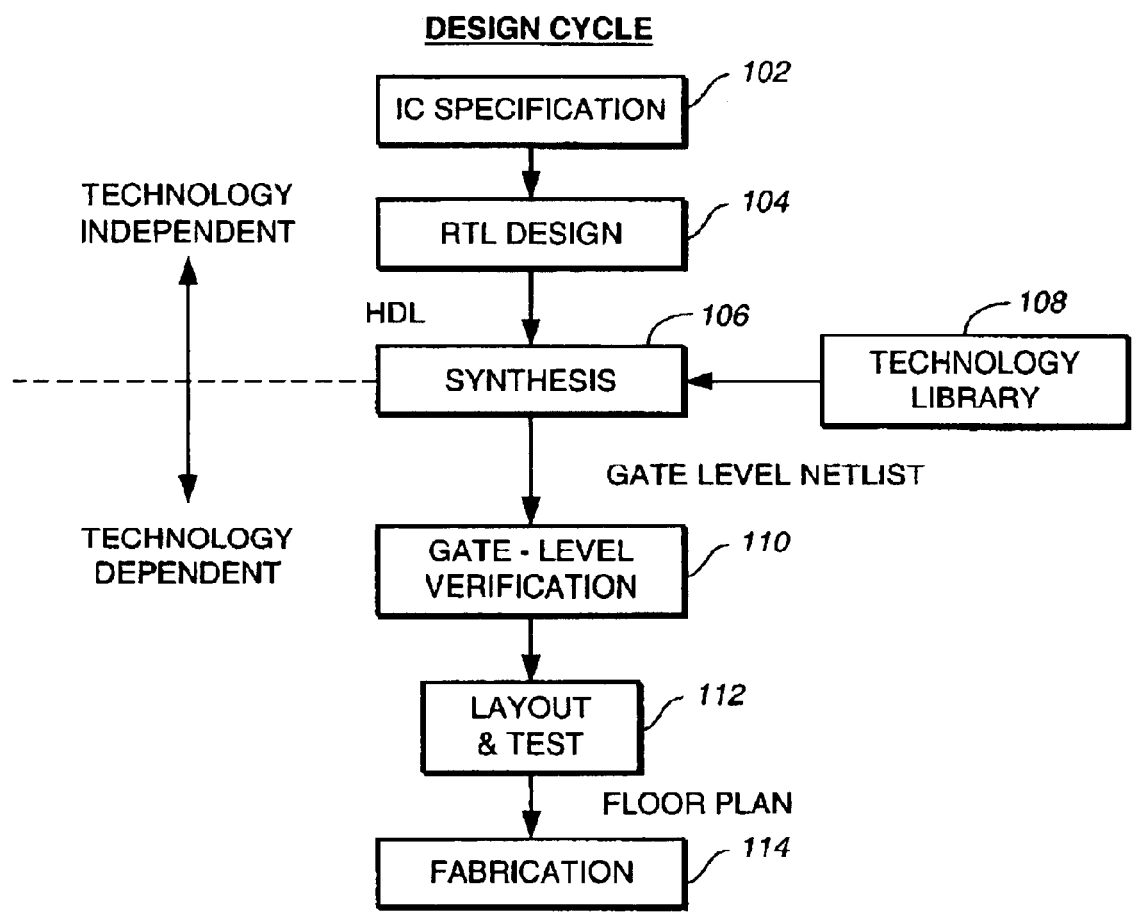
FIG._1 (PRIOR ART)

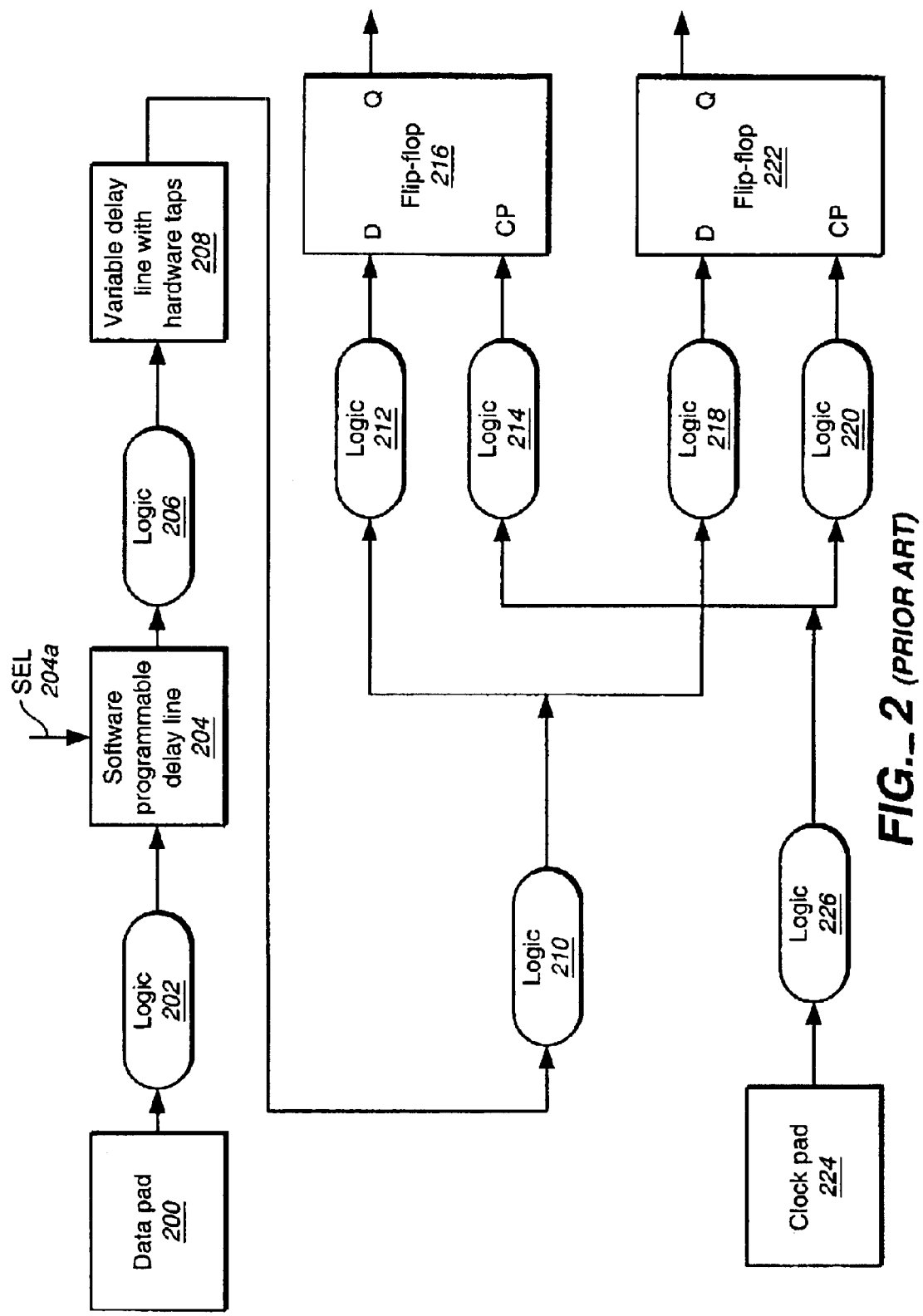
FIG._2 (PRIOR ART)

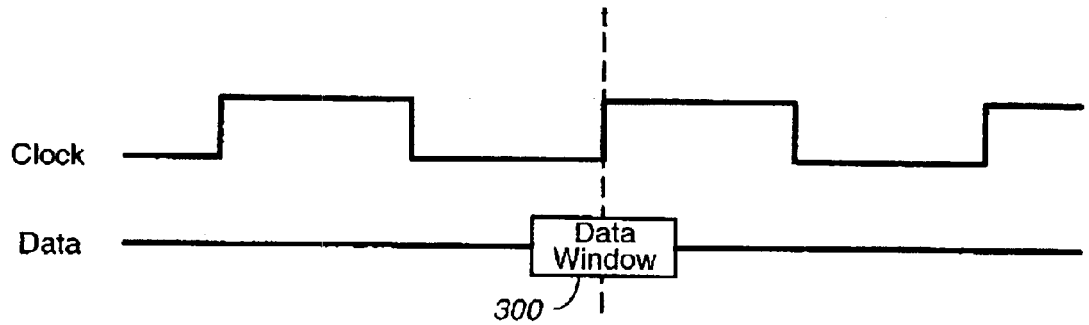
FIG._3 (PRIOR ART)
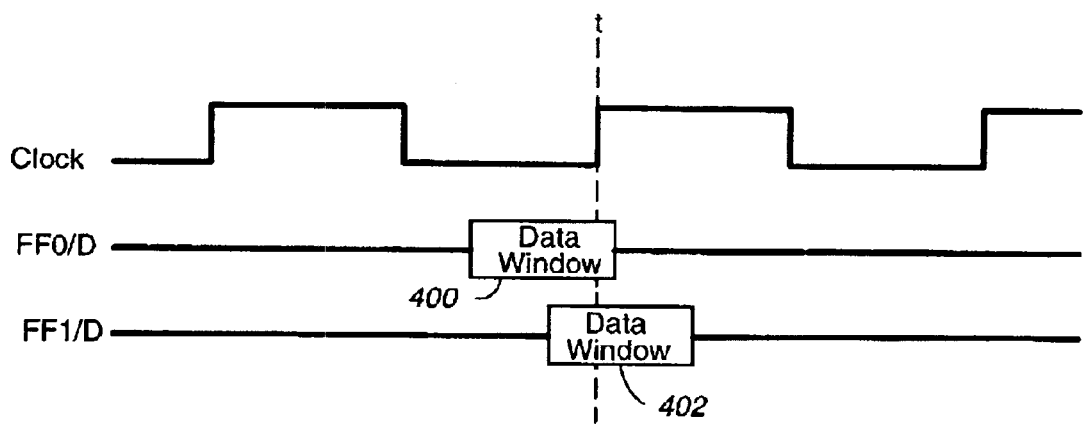
FIG._4 (PRIOR ART)
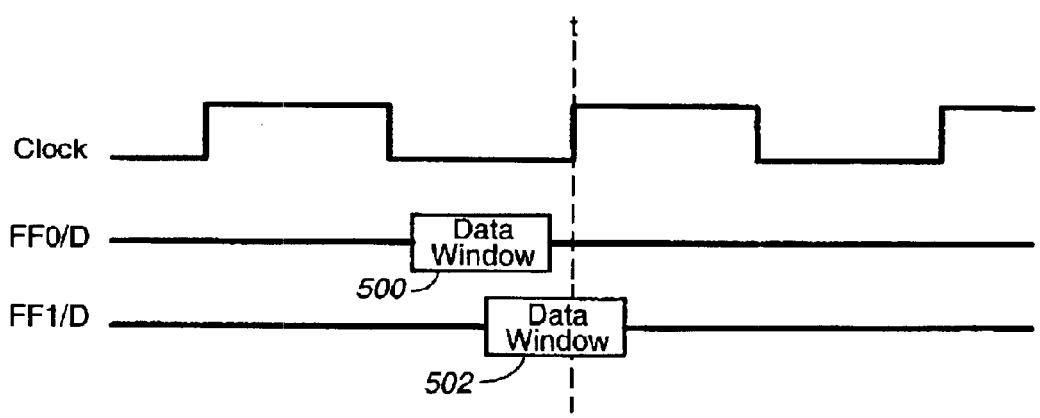
FIG._5 (PRIOR ART)

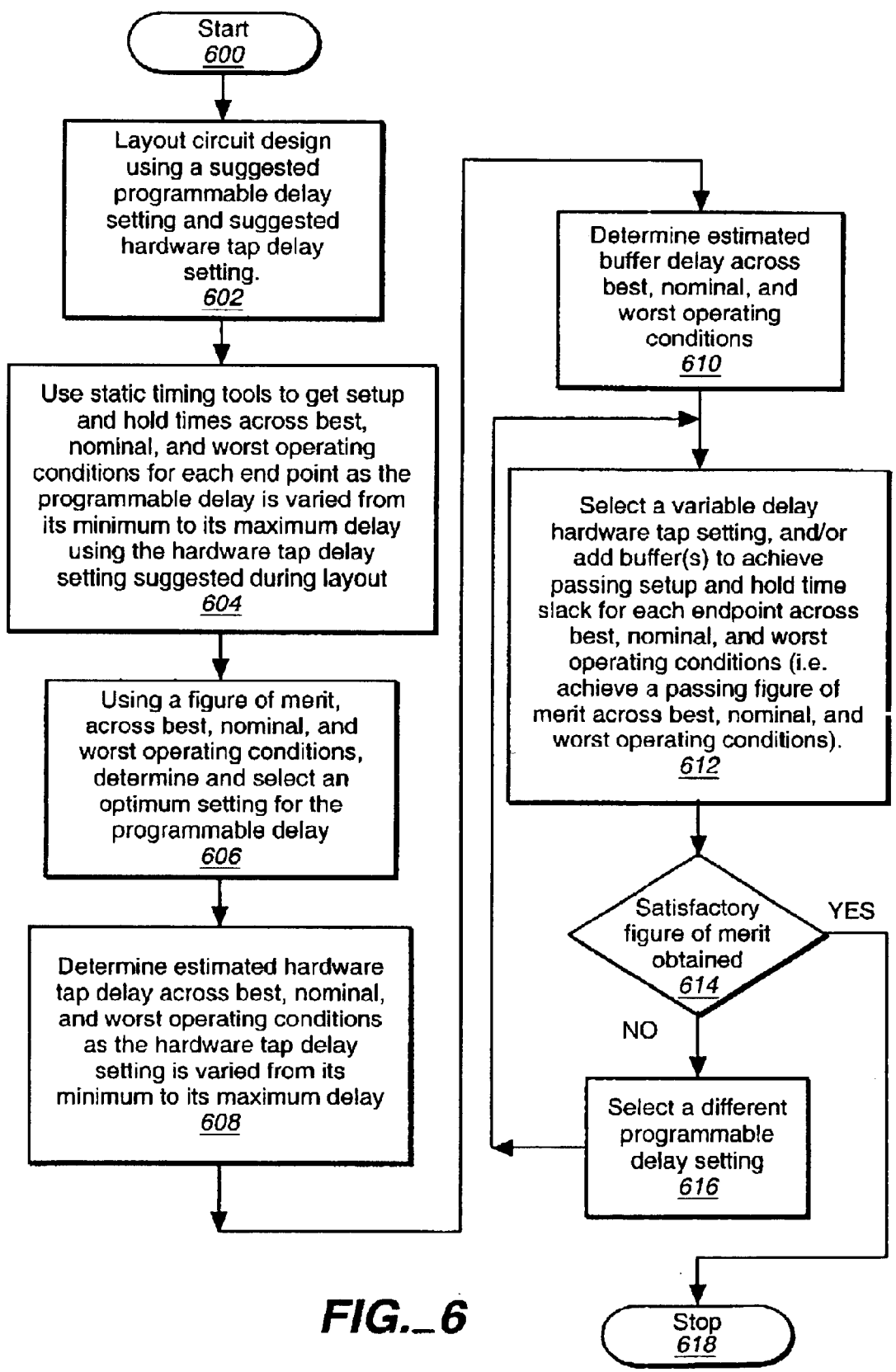
FIG._6

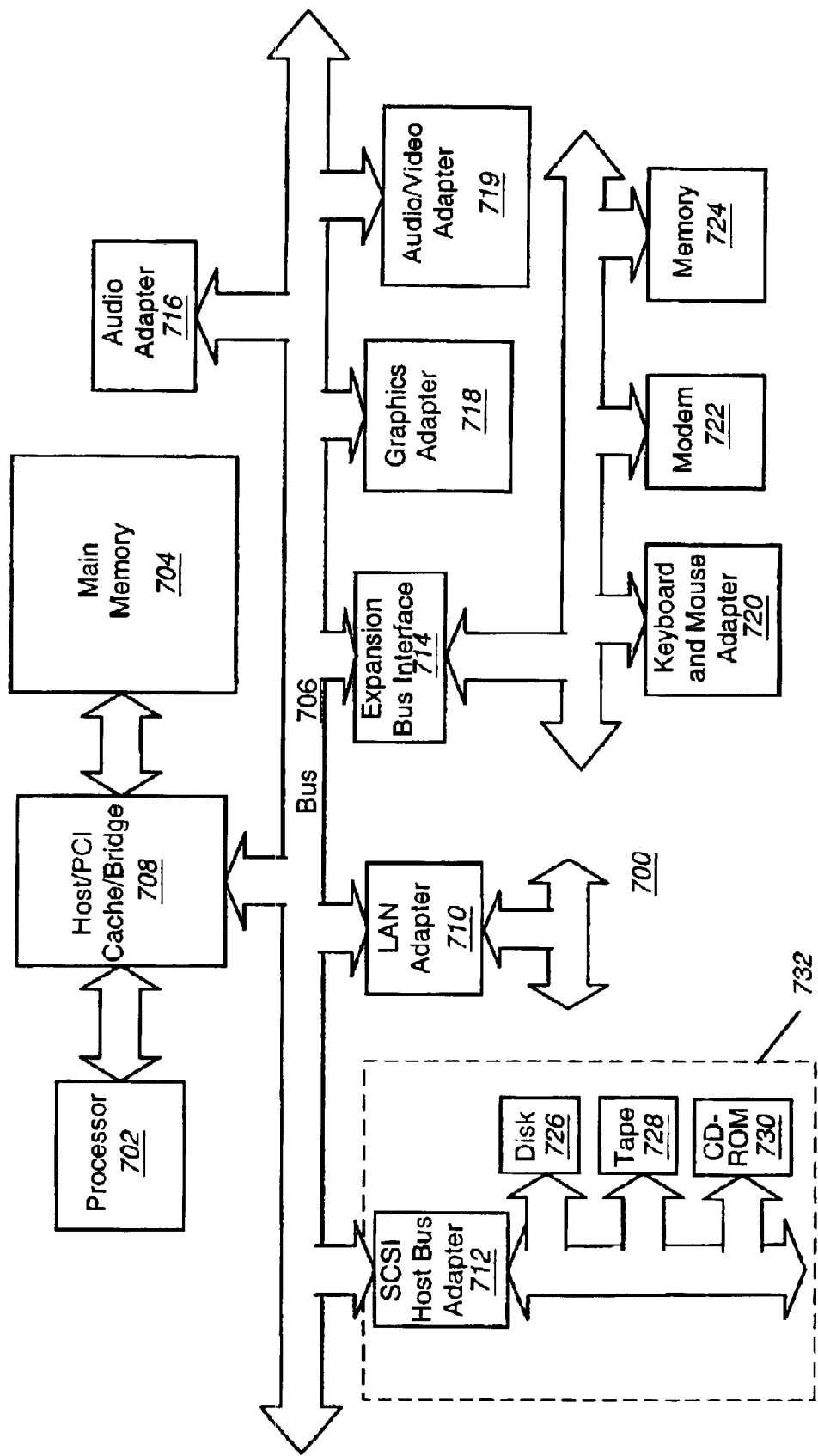
FIG._7

US 6,886,147 B2

METHOD, SYSTEM, AND PRODUCT FOR ACHIEVING OPTIMAL TIMING IN A DATA PATH THAT INCLUDES VARIABLE DELAY LINES AND COUPLED ENDPOINTS

BACKGROUND OF THE INVENTION

1. Technical Field

The present invention relates generally to a method, system, and product for obtaining optimal timing in a data path that includes variable delay lines and coupled endpoints.

2. Description of the Related Art

Today, the design of most digital integrated circuits (IC's) is a highly structured process based on an HDL (Hardware Description Language) methodology. FIG. 1 illustrates a simplified flowchart representation of an IC design cycle. First, block 102 depicts specifying the IC to be designed. Then, the IC design is reduced to an HDL code, as illustrated by block 104. This level of design abstraction is referred to as the Registered Transfer Level (RTL), and is typically implemented using an HDL language such as Verilog-HDL ("Verilog") or VHDL. At the RTL level of abstraction, the IC design is specified by describing the operations that are performed on data as it flows between circuit inputs, outputs, and clocked registers. The RTL level description is referred to as the RTL code, which is generally written in Verilog or in VHDL.

The IC design, as expressed by the RTL code, is then synthesized to generate a gate-level description, or a netlist, as depicted by block 106. Synthesis is the step taken to translate the architectural and functional descriptions of the design, represented by RTL code, to a lower level of representation of the design such as a logic-level and gate-level descriptions. The IC design specification and the RTL code are technology independent. That is, the specification and the RTL code do not specify the exact gates or logic devices to be used to implement the design. However, the gate-level description of the IC design is technology dependent. This is because during the synthesis process, the synthesis tool uses a given technology library, as depicted by block 108, to map the technology independent RTL code into technology dependent gate-level netlists.

After the synthesis of the design, the gate-level netlist is verified, as depicted by block 110, and the layout of the circuit is determined as illustrated by block 112. The IC is then fabricated as depicted by block 114.

At the RTL level, designers must make all key design decisions such as design hierarchy and partitioning, clocking scheme, reset scheme, and locations of registers. All those decisions are contained and reflected in the RTL code. The RTL code is technology independent, as well as independent from design tools. As a result, some characteristics of the RTL code can strongly influence further design steps, including logic synthesis, gate-level simulation, static timing analysis, test insertion and layout. Unexpected problems and difficulties with the IC design can be encountered at any of these steps and cause implementation obstacles impacting project schedules and costs.

Encountered late in the design cycle, problems with the design can greatly impact project schedules and design cost. The later the problems are discovered, the more significant the impact and the higher the cost in time and expenditure to correct the error. For example, timing or routability problems encountered during layout can require a new run through logic synthesis, gate-level verification, and test logic insertion. Several iterations through synthesis and physical design are usually needed before converging to correct post-layout timing problems.

FIG. 2 depicts an example of a data path that may be included within an integrated circuit in accordance with the prior art. The illustrated data path includes delay lines and coupled endpoints. The data path has a start point at the pad Data 200 and is coupled to coupled endpoints, flip-flop 216 and flip-flop 222, through logic 202, software programmable delay line 204, logic 206, variable delay line with hardware taps 208, and logic 210.

Throughout the following description, flip-fop 216 is referred to as FF0 having a data input FF0/D and a clock input FF0/CP. Flip-fop 222 is referred to as FF1 having a data input FF1/D and a clock input FF1/CP.

Logic 212 may be included prior to the data input FF0/D into flip-flop 216. Logic 218 may be included prior to the data input FF1/D into flip-flop 222. Logic 214 may be included prior to the clock input FF0/CP into flip-flop 216. And, logic 220 may be included prior to the clock input FF1/CP into flip-flop 222. Programmable delay line 204 is a software programmable delay by using the SEL input port 204a. Variable delay line 208 uses hardware adjustable taps to alter its amount of delay. The flip-flop inputs FF0/CP and FF1/CP are clocked by the pad Clock 224. Additional logic 226 may be included after clock 224.

Those skilled in the art will recognize that one or more of the logic blocks 202, 206, 210, 212, 214, 218, 220, and 226 may or may not be included in the design.

The data signals depicted by FIGS. 3–5 are generated by data 200, and the clock signals are generated by clock 224 (see FIG. 2).

FIG. 3 illustrates an ideal timing diagram with equal data setup and hold times relative to the clock signal. At time t, the data window 300 has an equal data setup and hold time relative to the clock signal. Typical software synthesis programs will only optimize the data path shown in FIG. 2 until passing slack times, i.e. setup and hold time margins, are obtained at the coupled endpoints FF0/D and FF1/D. Thus, the data windows for FF0/D and FF1/D could be offset as depicted by data windows 400 and 402 shown in FIG. 4. Inaccuracies in delay line models and wireload models used during synthesis, and clock-tree balancing over best, nominal, and worst operating conditions could possibly cause the post-layout circuit to have one of the coupled endpoints failing either setup or hold times. For example, as illustrated by FIG. 5, data window 500 fails hold time while data window 502 meets the setup and hold times.

Therefore, in the prior art, although the setup and hold times are optimized for the coupled endpoints together, after the layout step, errors could still be present. For example, such as depicted by FIG. 5, one of the endpoints could fail timing although the coupled endpoints together met timing requirements during the synthesis step.

Therefore, a need exists for a method, system, and product for obtaining optimal timing post-layout for a data path that includes variable delay lines and coupled endpoints.

SUMMARY OF THE INVENTION

The present invention is a method, system, and product for optimizing timing in a circuit after layout of the circuit has been completed. The circuit includes at least one variable delay line and includes coupled endpoint devices. The variable delay line includes multiple, different selectable settings. A current setting of the variable delay line is varied from a maximum setting to a minimum setting. A timing accuracy indicator of a combination of the coupled endpoint devices is determined as the variable delay line is varied from its maximum setting to its minimum setting. Thus, multiple timing accuracy indicators are determined where an indicator is determined for and associated with each one of the settings from the maximum setting to the minimum setting. An optimum one of the selectable settings is determined utilizing the timing accuracy indicators, wherein the optimum one of the settings is associated with an optimum one of the multiple timing accuracy indicators.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 illustrates a simplified flowchart representation of an IC design cycle in accordance with the prior art;

FIG. 2 depicts an example of a data path that may be included within an integrated circuit in accordance with the prior art;

FIG. 3 illustrates an ideal timing diagram with equal data setup and hold times relative to the clock signal in accordance with the prior art;

FIG. 4 depicts a first timing diagram that occurred when data setup and hold times are optimized for coupled endpoints in accordance with the prior art;

FIG. 5 illustrates a second timing diagram that occurred when data setup and hold times are optimized for coupled endpoints where endpoint fails a timing requirement post-layout although the endpoints together meet timing requirements during synthesis in accordance with the prior art;

FIG. 6 depicts a high level flow chart which illustrates obtaining optimal timing post-layout for a data path that includes variable delay lines and coupled endpoints in accordance with the present invention; and FIG. 7 illustrates a block diagram of a data processing system that may be used to implement the present invention in accordance with the present invention.

DETAILED DESCRIPTION

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention and the practical application to enable others of ordinary skill in the art to understand the invention for various embodiments with various modifications as are suited to the particular use contemplated.

The present invention is a method, system, and product for obtaining optimal timing in a data path after the layout of the data path has been completed where the data path includes variable delay lines and coupled endpoints. Static timing analysis tools are used to determine the setup and hold times for each endpoint as the setting of a programmable delay line is varied from a minimum delay to a maximum delay. An optimum setting for the programmable delay line is then determined using a timing accuracy indicator, also referred to herein as a figure of merit.

A timing accuracy indicator is selected in order to optimize the timing taking into consideration both endpoints. In the preferred embodiment, the indicator is the total negative slack calculated by adding together all negative (i.e. failing) setup and hold slacks for each endpoint for each operating condition, i.e. the best, nominal, and worst operating conditions. The programmable delay line setting which produces the optimal indicator is then selected as the optimum setting for the programmable delay line. The optimal indicator will be zero total negative slack or, if zero total negative slack is not achievable the optimal indicator is the most positive total negative slack.

The data path also includes a variable delay line having hardware tap delay settings. An estimated delay through this variable delay is then obtained as the setting of the variable delay line is varied from its minimum setting to its maximum setting for each of the best, nominal, and worst operating conditions. Next, an estimated buffer delay is determined across the best, nominal, and worst operating conditions.

A hardware tap setting is then selected and/or one or more buffers may be added in order to achieve an optimal timing accuracy indicator, or passing setup and hold time slack for each endpoint, across the best, nominal, and worst operating conditions. The passing setup and hold times are determined using the timing accuracy indicator, or figure of merit, determined for each one of the best, nominal, and worst operating conditions. If the figure of merit is satisfactory, the process ends. If, however, the figure of merit is not satisfactory, a different setting for the programmable delay line may be selected.

As an example of the present invention, consider the circuit of FIG. 2. Assume programmable delay line 204 has a possible 256 settings and variable delay line 208 has 20 different hardware taps. Also assume that the circuit had a particular setting for the programmable delay line, and a particular setting for the hardware tap delay line after the layout process was complete that match the settings used during synthesis.

Using a static timing analysis tool on the post-layout circuit, the first step is to vary the setting for the programmable delay line from 0 to 255 and determine the setup and hold slacks for the data input FF0/D for flip-flop 216, and the setup and hold slacks for the data input FF1/D for flip-flop 222. These setup and hold slacks are determined for the best operating condition, the nominal operating condition, and the worst operating condition. This step generates a set of data for each setting of the programmable delay line. Thus, each setting of the programmable delay line will have an associated set of determined data. The data will include setup slacks and hold slacks for each endpoint at each programmable delay line setting for the best, nominal, and the worst case operating conditions.

Once that is completed, the timing accuracy indicator, or figure of merit, is determined for and associated with each setting of the programmable delay line. An example of a figure of merit is total negative slack, which is the sum of all of the negative (i.e. failing) setup slacks and hold slacks determined for the first endpoint, and the sum of all of the negative (i.e. failing) setup slacks and hold slacks determined for the second endpoint for each operating condition.

Thus, as an example, for a particular programmable delay setting, if the setup slack for the first endpoint during the nominal operating condition, the hold slack for the second endpoint for the nominal operating condition, the setup slack for the first endpoint for the worst operating conditions, and the hold slack for the second endpoint for the best operating conditions were all negative, all of these slacks would be added together to produce a timing accuracy indicator that is then associated with this particular programmable delay setting.

Next, the programmable delay line setting that produced the most positive total negative slack is selected as the initial optimum setting. Thus, the set of determined data associated with the optimum programmable delay line setting is used as a starting point in the equations described below (i.e. the variables Old Hold Slack FF0/D, Old Hold Slack FF1/D, Old Setup Slack FF0/D, and Old Setup Slack FF1/D).

Then, the estimated hardware tap delay is determined as the hardware tap delay setting is varied from 1–20. The delay is determined for each operating condition, i.e. the best, nominal, and worst operating conditions. This generates another set of data that is used to calculate the delta, or change in, variable delay line delay due to a variable delay line hardware tap change (i.e. variable "delta delay due to variable delay line tap change" in the equations described below). The optimum timing accuracy indicator may be recalculated for each hardware tap setting of the variable delay line. Thus, the delay for each hardware tap setting is considered, and a revised optimum timing accuracy indicator, i.e. revised total negative slack, is calculated taking the hardware tap setting into account. If the revised optimum timing accuracy indicator is satisfactory, the process ends. If, however, the revised optimum timing accuracy indicator is not satisfactory, buffers may be added as described below.

The typical buffer delay is determined for the best, nominal, and worst operating conditions. These values are then inserted into the calculation of the new slack for setup and for hold for each endpoint, FF0/D and FF1/D, at the best, nominal, and worst operating conditions as follows:

> New Hold Slack $FF0/D$=Old Hold Slack $FF0/D$+[(delay delta due to variable delay line tap change)+(delay due to any buffer(s) added that affects both $FF0/D$ and $FF1/D$)+(delay due to any buffer(s) added that affects only $FF0/D$)]
>
> New Hold Slack $FF1/D$=Old Hold Slack $FF1/D$+[(delay delta due to variable delay line tap change)+(delay due to any buffer(s) added that affects both $FF0/D$ and $FF1/D$)+(delay due to any buffer(s) added that affects only $FF1/D$)]
>
> New Setup Slack $FF0/D$=Old Setup Slack $FF0/D$−[(delay delta due to variable delay line tap change)+(delay due to any buffer(s) added that affects both $FF0/D$ and $FF1/D$)+(delay due to any buffer(s) added that affects only $FF0/D$)]
>
> New Setup Slack $FF1/D$=Old Setup Slack $FF1/D$−[(delay delta due to variable delay line tap change)+(delay due to any buffer(s) added that affects both $FF0/D$ and $FF1/D$)+(delay due to any buffer(s) added that affects only $FF1/D$)]

A revised total negative slack is determined for each combination of settings and additional buffers. In this manner, a revised total negative slack is obtained when the optimum programmable delay setting is used. If this revised total negative slack is satisfactory, these particular settings are used. However, if the total negative slack is not satisfactory, the programmable delay setting may be changed. When the programmable delay setting is changed, a different set of setup and hold slack data, i.e. the set associated with the new programmable delay setting, is used. A new total negative slack is determined for each combination of settings and additional buffers.

The circuit depicted by FIG. 2 is a one-bit circuit. Those skilled in the art will understand that the present invention may be utilized in a circuit that includes multiple bits or multiple channels having multiple bits in each channel.

Those skilled in the art will also recognize that the present invention may be utilized in any post-layout circuit, whether the layout is completed manually, by hand, or by synthesizing RTL code.

FIG. 6 depicts a high level flow chart which illustrates obtaining optimal timing post-layout for a data path that includes variable delay lines and coupled endpoints in accordance with the present invention. The process starts as depicted by block 600 and thereafter passes to block 602 which illustrates laying out a design using a suggested programmable delay setting and suggested hardware tap delay setting. Next, block 604 depicts using static timing analysis tools to get setup and hold times for the best, nominal, and worst case operating conditions for each endpoint as the programmable delay is varied from its minimum to its maximum delay using the hardware tap delay setting suggested during the layout process. The process then passes to block 606 which illustrates using a figure of merit, also referred to herein as a timing accuracy indicator, such as total negative slack, to determine and select an optimum setting for the programmable delay. The optimum setting is the setting that produces the most positive total negative slack for the endpoints considered together by adding together all negative setup and hold slacks for all endpoints for all operating conditions.

Block 608, then, depicts determining an estimated hardware tap delay across best, nominal, and worst case operating conditions as the hardware tap delay setting is varied from its minimum to its maximum delay. Thereafter, block 610 illustrates determining an estimated buffer delay across best, nominal, and worst case operating conditions.

Next, block 612 depicts selecting a variable delay hardware tap setting, and/or adding buffer(s) to achieve passing setup and hold time slack for each endpoint for all operating conditions. Passing setup and hold time slack for each endpoint is achieved by achieving a passing figure of merit, such as a zero value total negative slack, across best, nominal, and worst case operating conditions. The process then passes to block 614 which illustrates a determination of whether or not a satisfactory figure of merit was obtained by the selected settings. If a determination is made that a satisfactory figure of merit was not obtained, the process passes to block 616 which depicts selecting a different programmable delay setting. The process then passes back to block 612. Referring again to block 614, if a determination is made that a satisfactory figure of merit was obtained, the process passes to block 618.

FIG. 7 illustrates a block diagram of a data processing system that may be used to implement the present invention in accordance with the present invention. Data processing system 700 may be utilized to execute the method described above. Data processing system 700 employs a peripheral component interconnect (PCI) local bus architecture. Although the depicted example employs a PCI bus, other bus architectures such as Accelerated Graphics Port (AGP) and Industry Standard Architecture (ISA) may be used. Processor 702 and main memory 704 are connected to PCI local bus 706 through PCI bridge 708. PCI bridge 708 also may include an integrated memory controller and cache memory for processor 702. Additional connections to PCI local bus 706 may be made through direct component interconnection or through add-in boards. In the depicted example, local area network (LAN) adapter 710, SCSI host bus adapter 712, and expansion bus interface 714 are connected to PCI local bus 706 by direct component connection. In contrast, audio adapter 716, graphics adapter 718, and audio/video adapter 719 are connected to PCI local bus 706 by add-in boards inserted into expansion slots. Expansion bus interface 714 provides a connection for a keyboard and mouse adapter 720, modem 722, and additional memory 724. Small computer system interface (SCSI) host bus adapter 712 provides a connection for hard disk drive 726, tape drive 728, and CD-ROM drive 730. Typical PCI local bus implementations will support three or four PCI expansion slots or add-in connectors.

An operating system runs on processor 702 and is used to coordinate and provide control of various components within data processing system 700 in FIG. 7. The operating system may be a commercially available operating system, such as Windows 2000, which is available from Microsoft Corporation. An object oriented programming system such as Java may run in conjunction with the operating system and provide calls to the operating system from Java programs or applications executing on data processing system 700. "Java" is a trademark of Sun Microsystems, Inc. Instructions for the operating system, the object-oriented operating system, and applications or programs are located on storage devices, such as hard disk drive 726, and may be loaded into main memory 704 for execution by processor 702.

The present invention describes using static timing analysis tools to optimize a data path that includes a software programmable delay line and a hardware tap selectable variable delay line and coupled endpoints. The static timing analysis tools will be used to select an initial setting for a programmable delay line and an initial setting for a variable delay line that uses hardware taps.

Different sets of data are then obtained for a variety of operating conditions as the software programmable delay line is varied from its minimum to its maximum settings. Each set of data is associated with a particular setting of the programmable delay line. An optimum setting is chosen by selecting the setting which produced the optimum timing accuracy indicator. The preferred embodiment describes the timing accuracy indicator as being total negative slack (i.e. the sum of the negative (i.e. failing) setup and hold slacks determined for the first endpoint and the negative (i.e. failing) setup and hold slacks determined for the second endpoint when the programmable delay line has a particular setting across best, nominal, and worst case operating conditions). The setting that produced the most positive total negative slack is the initial optimum setting.

The delay added by the variable delay line is determined for each variable delay line hardware tap setting as the setting is varied from its minimum to its maximum setting across best, nominal, and worst case operating conditions. In addition, a typical delay added by a buffer is determined across best, nominal, and worst case operating conditions.

A timing accuracy indicator is recalculated for each setting of the variable delay line as each delay is added to the data path. Thus, a different timing accuracy indicator is determined for and associated with each hardware tap setting.

In addition, one or more buffers may be added in at any point within the data path to alter the timing accuracy indicator.

An optimum hardware tap setting for the variable delay line is selected by selecting the setting associated with a recalculated optimum timing accuracy indicator. Buffers may be added to further improve the recalculated optimum timing accuracy indicator.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for optimizing timing in a circuit after layout of the circuit has been completed, where the circuit includes a variable delay line and coupled endpoint devices, said variable delay line including a plurality of selectable settings, said method comprising the steps of:

varying a current setting of said variable delay line from a maximum setting to a minimum setting;

determining a timing accuracy indicator associated with each one of said plurality of selectable settings as said variable delay line is varied from said maximum setting to said minimum setting;

said timing accuracy indicator including a combination of timing information for each one of said endpoint devices; and selecting an optimum one of said plurality of selectable settings utilizing said timing accuracy indicator, wherein said optimum one of said plurality of selectable settings is associated with an optimum timing accuracy indicator.

2. The method according to claim 1, further comprising the steps of:

including a second variable delay line in said circuit, said second variable delay line including a second plurality of selectable settings;

varying a current setting of said second variable delay line from a maximum setting to a minimum setting;

determining a delay inserted by said second variable delay line as said current setting of said second variable delay line is varied from a maximum setting to a minimum setting; and determining whether said optimum timing accuracy indicator is improved as a delay is inserted by said second variable delay line as said current setting of said second variable delay line is varied from a maximum setting to a minimum setting.

3. The method according to claim 2, further comprising the steps of:
selecting one of said second plurality of selectable settings which most improves said optimum timing accuracy indicator.

4. The method according to claim 1, further comprising the steps of:
determining a delay inserted into said circuit by a single buffer;
determining whether said optimum one of said plurality of selectable settings provides passing timing requirements for said circuit; and
in response to a determination that said optimum one of said plurality of selectable settings does not provide passing timing requirements for said circuit, determining a quantity of buffers to be added to said circuit in order for said circuit to have passing timing requirements utilizing said determination of said delay for said single buffer.

5. The method according to claim 4, further comprising the steps of:
inserting said quantity of buffers in said circuit.

6. The method according to claim 1, wherein the step of determining a timing accuracy indicator further includes the steps of:
determining a first timing for a first one of said endpoint devices for each one of said plurality of settings;
determining a second timing for a second one of said endpoint devices for each one of said plurality of settings;
adding said first timing to said second timing to produce a total timing for said first and second endpoints combined for each one of said plurality of settings; and
said timing accuracy indicator being said total timing for each one of said plurality of settings, wherein a timing accuracy indicator is associated with each one of said plurality of settings.

7. The method according to claim 6, further comprising the steps of:
selecting an optimum one of said plurality of settings by determining a timing accuracy indicator that indicates a best total timing, said best total timing being associated with a particular one of said plurality of settings; and
determining that said particular one of said plurality of settings is said optimum one of said plurality of settings.

8. The method according to claim 1, further comprising the steps of:
determining a first timing for a first one of said endpoint devices for each one of said plurality of settings;
determining whether said first timing is a negative slack;
determining a second timing for a second one of said endpoint devices for each one of said plurality of settings;
determining whether said second timing is a negative slack;
in response to a determination that first and second timings are both negative slacks, adding said first timing to said second timing to produce a total timing for said first and second endpoints combined for each one of said plurality of settings; and
said timing accuracy indicator being said total timing for each one of said plurality of settings, wherein a timing accuracy indicator is associated with each one of said plurality of settings.

9. The method according to claim 1, further comprising the steps of:
determining a first timing for a first one of said endpoint devices for each one of said plurality of settings;
determining whether said first timing is a negative slack;
determining a second timing for a second one of said endpoint devices for each one of said plurality of settings;
determining whether said second timing is a negative slack;
determining a total timing for said first and second endpoints combined for each one of said plurality of settings by including said first timing in said total timing if said first timing is a negative slack and including said second timing in said total timing if said second timing is a negative slack; and
said timing accuracy indicator being said total timing for each one of said plurality of settings, wherein a timing accuracy indicator is associated with each one of said plurality of settings.

10. The method according to claim 1, further comprising the steps of:
determining a total negative slack for each one of said plurality of selectable settings, said total negative slack including any negative slack attributable to a first one of said endpoint devices and any negative slack attributable to a second one of said endpoint devices;
said total negative slack being a timing accuracy indicator for each one of said plurality of selectable settings; and
selecting an optimum one of said plurality of settings by selecting one of said plurality of settings that is associated with a particular timing accuracy indicator that indicates a most positive slack, wherein said particular timing accuracy indicator is said optimum timing accuracy indicator.

11. The method according to claim 10, further comprising the steps of:
including a second variable delay line in said circuit, said second variable delay line including a second plurality of selectable settings;
varying a current setting of said second variable delay line from a maximum setting to a minimum setting;
determining a delay inserted by said second variable delay line as said current setting of said second variable delay line is varied from a maximum setting to a minimum setting; and
determining whether said optimum timing accuracy indicator is improved as a delay is inserted by said second variable delay line as said current setting of said second variable delay line is varied from a maximum setting to a minimum setting.

12. The method according to claim 11, further comprising the step of:
in response to a determination that said optimum timing accuracy indicator is improved as a delay is inserted by said second variable delay line, selecting a particular one of said second plurality of settings which is associated with a delay inserted by said second variable delay line which most improves said optimum timing accuracy indicator, wherein a revised timing accuracy indicator is obtained.

13. The method according to claim 12, further comprises the steps of:
- determining whether said revised timing accuracy indicator indicates passing timing;
- in response to a determination that said revised timing accuracy indicator does not indicate passing timing, determining a delay inserted into said circuit by a single buffer;
- determining whether said optimum one of said plurality of selectable settings provides passing timing requirements for said circuit;
- in response to a determination that said optimum one of said plurality of selectable settings does not provide passing timing requirements for said circuit, determining a quantity of buffers to be added to said circuit in order for said circuit to have passing timing requirements utilizing said determination of said delay for said single buffer; and
- inserting said quantity of buffers to said circuit.

14. A system for optimizing timing in a circuit after layout of the circuit has been completed, where the circuit includes a variable delay line and coupled endpoint devices, said variable delay line including a plurality of selectable settings, comprising:
- varying means for varying a current setting of said variable delay line from a maximum setting to a minimum setting;
- determining means for determining a timing accuracy indicator associated with each one of said plurality of selectable settings as said variable delay line is varied from said maximum setting to said minimum setting;
- said timing accuracy indicator including a combination of timing information for each one of said endpoint devices; and
- selecting means for selecting an optimum one of said plurality of selectable settings utilizing said timing accuracy indicator, wherein said optimum one of said plurality of selectable settings is associated with an optimum timing accuracy indicator.

15. The system according to claim 14, further comprising:
- a second variable delay line being included in said circuit, said second variable delay line including a second plurality of selectable settings;
- varying means for varying a current setting of said second variable delay line from a maximum setting to a minimum setting;
- determining means for determining a delay inserted by said second variable delay line as said current setting of said second variable delay line is varied from a maximum setting to a minimum setting; and
- determining means for determining whether said optimum timing accuracy indicator is improved as a delay is inserted by said second variable delay line as said current setting of said second variable delay line is varied from a maximum setting to a minimum setting.

16. The system according to claim 15, further comprising:
- selecting means for selecting one of said second plurality of selectable settings which most improves said optimum timing accuracy indicator.

17. The system according to claim 14, further comprising:
- determining means for determining a delay inserted into said circuit by a single buffer;
- determining means for determining whether said optimum one of said plurality of selectable settings provides passing timing requirements for said circuit; and
- in response to a determination that said optimum one of said plurality of selectable settings does not provide passing timing requirements for said circuit, determining means for determining a quantity of buffers to be added to said circuit in order for said circuit to have passing timing requirements utilizing said determination of said delay for said single buffer.

18. The system according to claim 17, further comprising:
- said quantity of buffers being inserted in said circuit.

19. The system according to claim 14, wherein said determining means for determining a timing accuracy indicator further includes:
- determining means for determining a first timing for a first one of said endpoint devices for each one of said plurality of settings;
- determining means for determining a second timing for a second one of said endpoint devices for each one of said plurality of settings;
- adding means for adding said first timing to said second timing to produce a total timing for said first and second endpoints combined for each one of said plurality of settings; and
- said timing accuracy indicator being said total timing for each one of said plurality of settings, wherein a timing accuracy indicator is associated with each one of said plurality of settings.

20. The system according to claim 19, further comprising:
- selecting means for selecting an optimum one of said plurality of settings by determining a timing accuracy indicator that indicates a best total timing, said best total timing being associated with a particular one of said plurality of settings; and
- determining means for determining that said particular one of said plurality of settings is said optimum one of said plurality of settings.

21. The system according to claim 14, further comprising:
- determining means for determining a first timing for a first one of said endpoint devices for each one of said plurality of settings;
- determining means for determining whether said first timing is a negative slack;
- determining means for determining a second timing for a second one of said endpoint devices for each one of said plurality of settings;
- determining means for determining whether said second timing is a negative slack;
- in response to a determination that first and second timings are both negative slacks, adding means for adding said first timing to said second timing to produce a total timing for said first and second endpoints combined for each one of said plurality of settings; and
- said timing accuracy indicator being said total timing for each one of said plurality of settings, wherein a timing accuracy indicator is associated with each one of said plurality of settings.

22. The system according to claim 14, further comprising:
- determining means for determining a first timing for a first one of said endpoint devices for each one of said plurality of settings;
- determining means for determining whether said first timing is a negative slack;
- determining a second timing for a second one of said endpoint devices for each one of said plurality of settings;
- determining means for determining whether said second timing is a negative slack;
- determining means for determining a total timing for said first and second endpoints combined for each one of said plurality of settings by including said first timing in said total timing if said first timing is a negative slack and including said second timing in said total timing if said second timing is a negative slack; and said timing accuracy indicator being said total timing for each one of said plurality of settings, wherein a timing accuracy indicator is associated with each one of said plurality of settings.

23. The system according to claim 14, further comprising:

determining means for determining a total negative slack for each one of said plurality of selectable settings, said total negative slack including any negative slack attributable to a first one of said endpoint devices and any negative slack attributable to a second one of said endpoint devices;

said total negative slack being a timing accuracy indicator for each one of said plurality of selectable settings; and selecting means for selecting an optimum one of said plurality of settings by selecting one of said plurality of settings that is associated with a particular timing accuracy indicator that indicates a most positive slack, wherein said particular timing accuracy indicator is said optimum timing accuracy indicator.

24. The system according to claim 23, further comprising:

a second variable delay line being included in said circuit, said second variable delay line including a second plurality of selectable settings;

varying means for varying a current setting of said second variable delay line from a maximum setting to a minimum setting;

determining means for determining a delay inserted by said second variable delay line as said current setting of said second variable delay line is varied from a maximum setting to a minimum setting; and determining means for determining whether said optimum timing accuracy indicator is improved as a delay is inserted by said second variable delay line as said current setting of said second variable delay line is varied from a maximum setting to a minimum setting.

25. The system according to claim 24, further comprising:

in response to a determination that said optimum timing accuracy indicator is improved as a delay is inserted by said second variable delay line, selecting means for selecting a particular one of said second plurality of settings which is associated with a delay inserted by said second variable delay line which most improves said optimum timing accuracy indicator, wherein a revised timing accuracy indicator is obtained.

26. The system according to claim 25, further comprises:

determining means for determining whether said revised timing accuracy indicator indicates passing timing;

in response to a determination that said revised timing accuracy indicator does not indicate passing timing, determining means for determining a delay inserted into said circuit by a single buffer;

determining means for determining whether said optimum one of said plurality of selectable settings provides passing timing requirements for said circuit;

in response to a determination that said optimum one of said plurality of selectable settings does not provide passing timing requirements for said circuit, determining means for determining a quantity of buffers to be added to said circuit in order for said circuit to have passing timing requirements utilizing said determination of said delay for said single buffer; and inserting means for inserting said quantity of buffers to said circuit.

27. A computer program product in a data processing system for optimizing timing in a circuit after layout of the circuit has been completed, where the circuit includes a variable delay line and coupled endpoint devices, said variable delay line including a plurality of selectable settings, said product comprising:

instruction means for varying a current setting of said variable delay line from a maximum setting to a minimum setting;

instruction means for determining a timing accuracy indicator associated with each one of said plurality of selectable settings as said variable delay line is varied from said maximum setting to said minimum setting;

said timing accuracy indicator including a combination of timing information for each one of said endpoint devices; and instruction means for selecting an optimum one of said plurality of selectable settings utilizing said timing accuracy indicator, wherein said optimum one of said plurality of selectable settings is associated with an optimum timing accuracy indicator.

28. The product according to claim 27, further comprising:

instruction means for including a second variable delay line in said circuit, said second variable delay line including a second plurality of selectable settings;

instruction means for varying a current setting of said second variable delay line from a maximum setting to a minimum setting;

instruction means for determining a delay inserted by said second variable delay line as said current setting of said second variable delay line is varied from a maximum setting to a minimum setting; and instruction means for determining whether said optimum timing accuracy indicator is improved as a delay is inserted by said second variable delay line as said current setting of said second variable delay line is varied from a maximum setting to a minimum setting.

29. The product according to claim 27, further comprising:

instruction means for selecting one of said second plurality of selectable settings which most improves said optimum timing accuracy indicator.

30. The product according to claim 27, further comprising:

instruction means for determining a delay inserted into said circuit by a single buffer;

instruction means for determining whether said optimum one of said plurality of selectable settings provides passing timing requirements for said circuit; and in response to a determination that said optimum one of said plurality of selectable settings does not provide passing timing requirements for said circuit, instruction means for determining a quantity of buffers to be added to said circuit in order for said circuit to have passing timing requirements utilizing said determination of said delay for said single buffer.

31. The product according to claim 30, further comprising:

instruction means for inserting said quantity of buffers in said circuit.

32. The product according to claim 27, wherein said instruction means for determining a timing accuracy indicator further includes:

instruction means for determining a first timing for a first one of said endpoint devices for each one of said plurality of settings;

instruction means for determining a second timing for a second one of said endpoint devices for each one of said plurality of settings;

instruction means for adding said first timing to said second timing to produce a total timing for said first and second endpoints combined for each one of said plurality of settings; and said timing accuracy indicator being said total timing for each one of said plurality of settings, wherein a timing accuracy indicator is associated with each one of said plurality of settings.

33. The product according to claim 32, further comprising:

instruction means for selecting an optimum one of said plurality of settings by determining a timing accuracy indicator that indicates a best total timing, said best total timing being associated with a particular one of said plurality of settings; and instruction means for determining that said particular one of said plurality of settings is said optimum one of said plurality of settings.

34. The product according to claim 27, further comprising:

instruction means for determining a first timing for a first one of said endpoint devices for each one of said plurality of settings;

instruction means for determining whether said first timing is a negative slack;

instruction means for determining a second timing for a second one of said endpoint devices for each one of said plurality of settings;

instruction means for determining whether said second timing is a negative slack;

in response to a determination that first and second timings are both negative slacks, instruction means for adding said first timing to said second timing to produce a total timing for said first and second endpoints combined for each one of said plurality of settings; and said timing accuracy indicator being said total timing for each one of said plurality of settings, wherein a timing accuracy indicator is associated with each one of said plurality of settings.

35. The product according to claim 27, further comprising:

instruction means for determining a first timing for a first one of said endpoint devices for each one of said plurality of settings;

instruction means for determining whether said first timing is a negative slack;

instruction means for determining a second timing for a second one of said endpoint devices for each one of said plurality of settings;

instruction means for determining whether said second timing is a negative slack;

instruction means for determining a total timing for said first and second endpoints combined for each one of said plurality of settings by including said first timing in said total timing if said first timing is a negative slack and including said second timing in said total timing if said second timing is a negative slack; and said timing accuracy indicator being said total timing for each one of said plurality of settings, wherein a timing accuracy indicator is associated with each one of said plurality of settings.

36. The product according to claim 27, further comprising:

instruction means for determining a total negative slack for each one of said plurality of selectable settings, said total negative slack including any negative slack attributable to a first one of said endpoint devices and any negative slack attributable to a second one of said endpoint devices;

said total negative slack being a timing accuracy indicator for each one of said plurality of selectable settings; and instruction means for selecting an optimum one of said plurality of settings by selecting one of said plurality of settings that is associated with a particular timing accuracy indicator that indicates a most positive slack, wherein said particular timing accuracy indicator is said optimum timing accuracy indicator.

37. The product according to claim 36, further comprising:

instruction means for including a second variable delay line in said circuit, said second variable delay line including a second plurality of selectable settings;

instruction means for varying a current setting of said second variable delay line from a maximum setting to a minimum setting;

instruction means for determining a delay inserted by said second variable delay line as said current setting of said second variable delay line is varied from a maximum setting to a minimum setting; and instruction means for determining whether said optimum timing accuracy indicator is improved as a delay is inserted by said second variable delay line as said current setting of said second variable delay line is varied from a maximum setting to a minimum setting.

38. The product according to claim 37, further comprising:

in response to a determination that said optimum timing accuracy indicator is improved as a delay is inserted by said second variable delay line, instruction means for selecting a particular one of said second plurality of settings which is associated with a delay inserted by said second variable delay line which most improves said optimum timing accuracy indicator, wherein a revised timing accuracy indicator is obtained.

39. The product according to claim 38, further comprises:

instruction means for determining whether said revised timing accuracy indicator indicates passing timing;

in response to a determination that said revised timing accuracy indicator does not indicate passing timing, instruction means for determining a delay inserted into said circuit by a single buffer;

instruction means for determining whether said optimum one of said plurality of selectable settings provides passing timing requirements for said circuit;

in response to a determination that said optimum one of said plurality of selectable settings does not provide passing timing requirements for said circuit, instruction means for determining a quantity of buffers to be added to said circuit in order for said circuit to have passing timing requirements utilizing said determination of said delay for said single buffer; and instruction means for inserting said quantity of buffers to said circuit.

* * * * *